United States Patent
Tiu et al.

(10) Patent No.: US 8,981,541 B2
(45) Date of Patent: Mar. 17, 2015

(54) QUAD FLAT SEMICONDUCTOR DEVICE WITH ADDITIONAL CONTACTS

(71) Applicants: Kong Bee Tiu, Port Klang (MY); Ruzaini B. Ibrahim, Bandar Puncak Alam (MY); Wai Yew Lo, Petaling Jaya (MY)

(72) Inventors: Kong Bee Tiu, Port Klang (MY); Ruzaini B. Ibrahim, Bandar Puncak Alam (MY); Wai Yew Lo, Petaling Jaya (MY)

(73) Assignee: Freescale Semiconductor, Inc., Austin, TX (US)

( * ) Notice: Subject to any disclaimer, the term of this patent is extended or adjusted under 35 U.S.C. 154(b) by 14 days.

(21) Appl. No.: 13/938,231

(22) Filed: Jul. 10, 2013

(65) Prior Publication Data
US 2015/0014833 A1    Jan. 15, 2015

(51) Int. Cl.
*H01L 23/495* (2006.01)
*H01L 23/48* (2006.01)
*H01L 23/52* (2006.01)
*H01L 29/40* (2006.01)
*H01L 23/00* (2006.01)

(52) U.S. Cl.
CPC .......... *H01L 23/49575* (2013.01); *H01L 24/83* (2013.01)

USPC .......... 257/676; 257/696; 257/738; 257/774

(58) Field of Classification Search
CPC .......... H01L 23/495; H01L 23/49503; H01L 23/49541; H01L 23/49551
USPC .......... 257/676, 692, 666, 696, 738, E23.011, 257/E23.031, 774, 730, E33.06, E23.037, 257/690, E21.499; 438/25, 111, 123
See application file for complete search history.

(56) References Cited

U.S. PATENT DOCUMENTS

| | | | |
|---|---|---|---|
| 6,157,080 A * | 12/2000 | Tamaki et al. | 257/738 |
| 7,687,892 B2 | 3/2010 | Espiritu | |
| 7,977,774 B2 | 7/2011 | Choi | |
| 7,989,933 B1 | 8/2011 | Kim | |
| 2004/0080025 A1* | 4/2004 | Kasahara et al. | 257/666 |
| 2005/0124147 A1* | 6/2005 | Shiu et al. | 438/613 |
| 2007/0099341 A1* | 5/2007 | Lo | 438/106 |
| 2010/0072599 A1* | 3/2010 | Camacho et al. | 257/686 |
| 2010/0075462 A1* | 3/2010 | Lo | 438/110 |

* cited by examiner

*Primary Examiner* — Long K Tran
*Assistant Examiner* — Dzung Tran
(74) *Attorney, Agent, or Firm* — Charles Bergere

(57) ABSTRACT

A Quad Flat Package (QFP) semiconductor device has a multi-stepped lead frame for forming rows of external contacts. A semiconductor die is attached to a die pad of the lead frame and electrically connected to lead with bond wires. The die and bond wires are encapsulated with a mold compound and then multiple cuts are made to the lead frame to form the rows of external contacts.

9 Claims, 4 Drawing Sheets

US 8,981,541 B2

QUAD FLAT SEMICONDUCTOR DEVICE WITH ADDITIONAL CONTACTS

BACKGROUND OF THE INVENTION

The present invention is directed to a quad flat package (QFP) type semiconductor device and, more particularly, to a QFP device have an additional row of external electrical contacts.

Semiconductor device packaging fulfills basic functions such as providing electric connections and protecting the die against mechanical and environmental stresses. A surface mount semiconductor device has exposed electrical contacts that allow it to mounted on a support, such as a printed circuit board (PCB), for example, where its exposed electrical contacts provide for electrical communication with the PCB or with other circuitry or devices via the PCB. That is, the exposed electrical contacts of the device can be soldered directly to corresponding electrical contact pads on the support, providing mechanical attachment as well as electrical connections. Semiconductor devices are commonly packaged for surface mounting by encapsulating one or more semiconductor dies, the encapsulation process covers the die or dies with a molding compound.

The semiconductor device commonly has an electrically and thermally conductive metal flag (also called die pad or paddle), which participates in cooling the device, whether or not the flag is exposed at the surface of the encapsulation. It is common to facilitate manufacturing operations by performing many of the operations on an array of the semiconductor dies mounted on an array of flags that are linked together, the links being severed during a singulation process. The links are typically provided by a frame structure (e.g., an array of lead frames), which has an array of the flags connected by tie bars to frame members that are removed or cut off and discarded during singulation. The frame structure may also include sets of the exposed leads and electrical contacts that are supported directly or indirectly by the frame members and/or the flags, until the dies are encapsulated, and then the exposed leads and electrical contacts isolated from each other during singulation. This technique is applicable to devices where the leads and electrical contacts are disposed at the periphery of the flag and the semiconductor die, on two opposite sides or around all four sides.

In one type of surface mount semiconductor device, the flag is exposed at its bottom face but in another type the flag as well as the die are embedded in the mold compound. In one type of package, known as quad flat no-lead (QFN), the exposed electrical contacts are positioned in the bottom face of the body of the device at or close to its edge surface. In a QFP, exposed leads project from the edge surface of the body of the device and down to the level of the bottom face of the device in a gull-wing or J-shape configuration.

Various techniques are available for connecting the exposed electrical contacts of the device internally with electrical contact pads of the semiconductor die. In a wire bond package, typically the back face of the die is mounted on the flag and the contact pads of the die on its active face are connected to the exposed electrical contacts of the package with bond wires.

Continued reduction in the size of semiconductor devices and increase in their complexity and functionality result in a need for an increase in the number of exposed electrical contacts and a reduction in the spacing between the electrical contacts and the spacing between the bond wires. A QFP can include one or more rows of electrical contacts exposed in the bottom face of the device in addition to the exposed leads projecting from the edge surface. It would be desirable to allow for more exposed electrical contacts.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale.

DETAILED DESCRIPTION OF THE INVENTION

A conventional QFP device may include one or more rows of exposed electrical contacts on its bottom surface or face, in addition to leads projecting from its sides. The present invention makes available more bond zones for bottom face electrical contacts.

Figure 1:
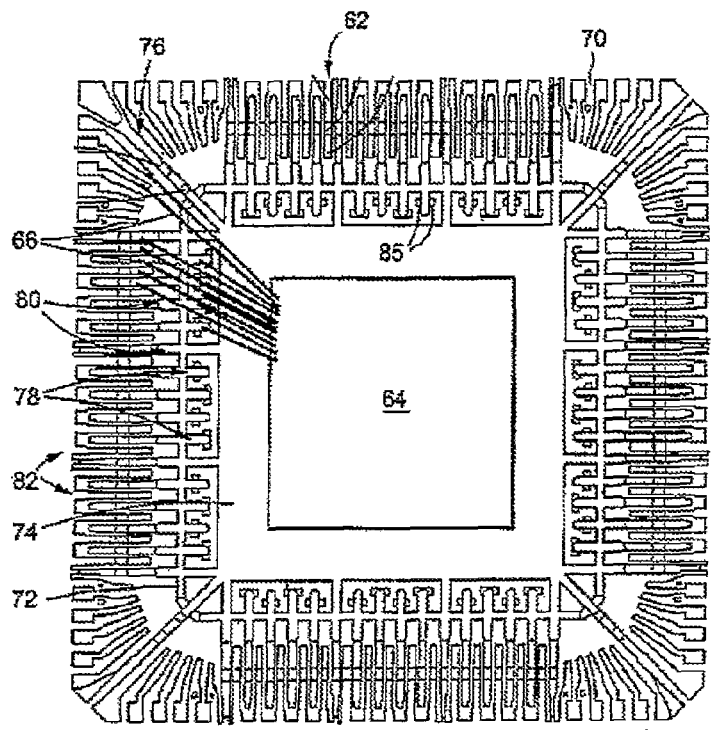
FIG. 1 is a top plan view of a partially assembled conventional QFP device.
Figure 2:
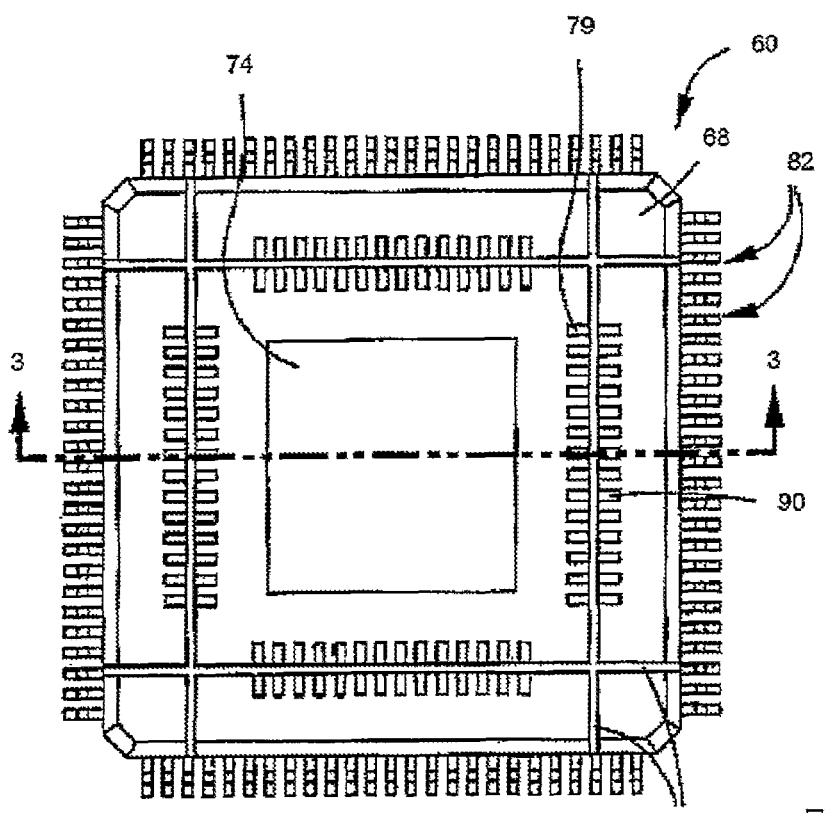
FIG. 2 is a bottom plan view of a QFP device assembled using the lead frame of FIG. 1.
Figure 3:
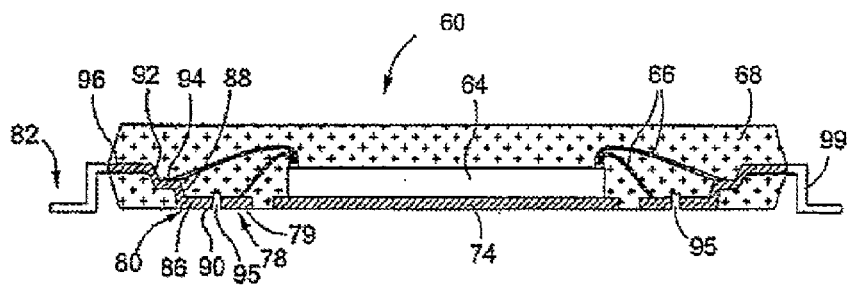
FIG. 3 is a side cross-sectional view along the line 3-3 of the QFP device of FIG. 2.

FIGS. 1-3 illustrate a conventional QFP device 60. The QFP device 60 comprises a lead frame 62, a semiconductor die 64 attached to the lead frame 62 and electrically connected thereto with bond wires 66, and a molding compound that encapsulates the die 64, bond wires 66 and partially encapsulates the lead frame 62, to form a package body 68 having top and bottom surfaces and sides or edge surfaces. The lead frame 62 includes a peripheral outer frame area 70. Located within the outer frame area 70 is a continuous, generally rectangular tie ring 72. The lead frame 62 also has a flag 74 upon which the die 64 is mounted. As shown in FIG. 1, the flag 74 is connected to the tie ring 72 with a tie bar 76.

The lead frame 62 also has first bottom face contacts 78 that are integrally connected to the tie ring 72 and extend inwardly toward the flag 74 in spaced relation thereto, and second bottom face contacts 80 that are integral with and extend outwardly from the tie ring 72 toward the peripheral outer frame area 70. In addition to the first and second contacts 78, 80, the lead frame 62 includes a plurality of side leads 82 that extend out from the side edges of the package body 68.

Each of the first contacts 78 defines opposed, generally planar top and bottom contact surfaces, the bottom contact surfaces defining first terminals 79 of the QFP device 60. Each of the second contacts 80 has an inner end portion 86 that extends and is attached to a corresponding segment of the tie ring 72. Each of the second contacts 80 also includes a first bend or down set 88 formed therein in relative close proximity to the inner end portion 86. In this regard, the inner end portion 86 of each second contact 80 is disposed between the first down set 88 thereof and the tie ring 72. The inner end portion 86 defines opposed top and bottom surfaces that extend in generally coplanar relation to respective ones of the top and bottom surfaces of the flag 74. The bottom surface of the inner end portion 86 of each second contact 80 further defines a second terminal 90 of the QFP device 60.

In addition to the first down set 88, each of the second contacts 80 includes a second down set 92. Defined between the first and second down sets 88, 92 is a wire bond zone 94 that extends in spaced, generally parallel relation to the flag 74 and hence the inner end portion 86 of the corresponding second contact 80. Each second contact 80 further has an outer end portion 96 that also extends in spaced, generally parallel relation to the flag 74, and is located between the second down set 92 and the outer frame area 70. As can be seen in FIG. 3, the side leads 82 extend from a bend 99 formed at the outer end portion 96 such that the side leads 82 are on the same plane as the first and second terminals 79, 90, and the flag 74.

The bond wires 66 extend from bond pads on the top surface of the die 64 to a top surface of the first contacts 78 and the wire bond zone 94 of the second contacts 80. During assembly, as can be seen in FIGS. 2 and 3, cuts are made along saw streets 95 to remove the tie ring 72 and separate the first and second contacts 78, 80. Thus, the first and second terminals 79, 90 are exposed in and substantially flush with the bottom face of the package body 68, as is the bottom surface of the flag 74, while the side leads 82 extend out of the sides of the package body 68 and then are bent such that the distal ends thereof are co-planar with the first and second terminals 79, 90.

The present invention provides at least one additional row of external, exposed terminals when compared to the prior art device described above by providing a stepped package body that allows for an additional cut to be made to the leads such that the side leads and first and second bottom contacts can each be connected to different die bond pads with different bond wires. This feature of the present invention will become more apparent based on the following description.

Figure 4:
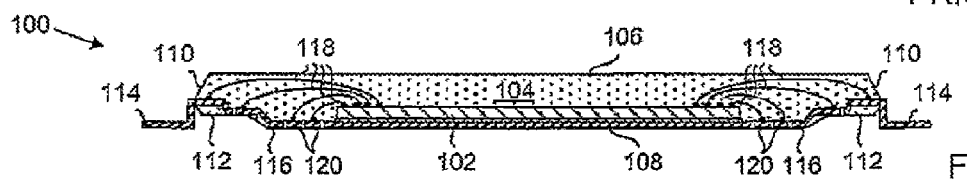
FIG. 4 is a side cross-sectional view along the line 4-4 of FIG. 6 of a QFP device in accordance with an embodiment of the invention, given by way of example.
Figure 5:
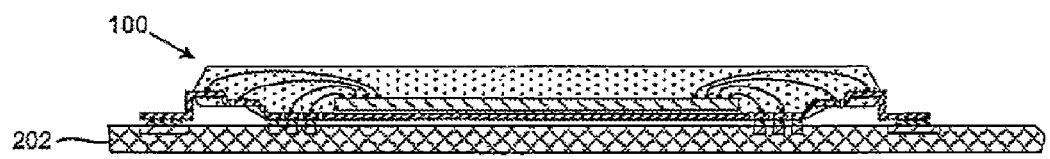
FIG. 5 is a side cross-sectional view of the QFP device of FIG. 4 mounted on a PCB.
Figure 6:
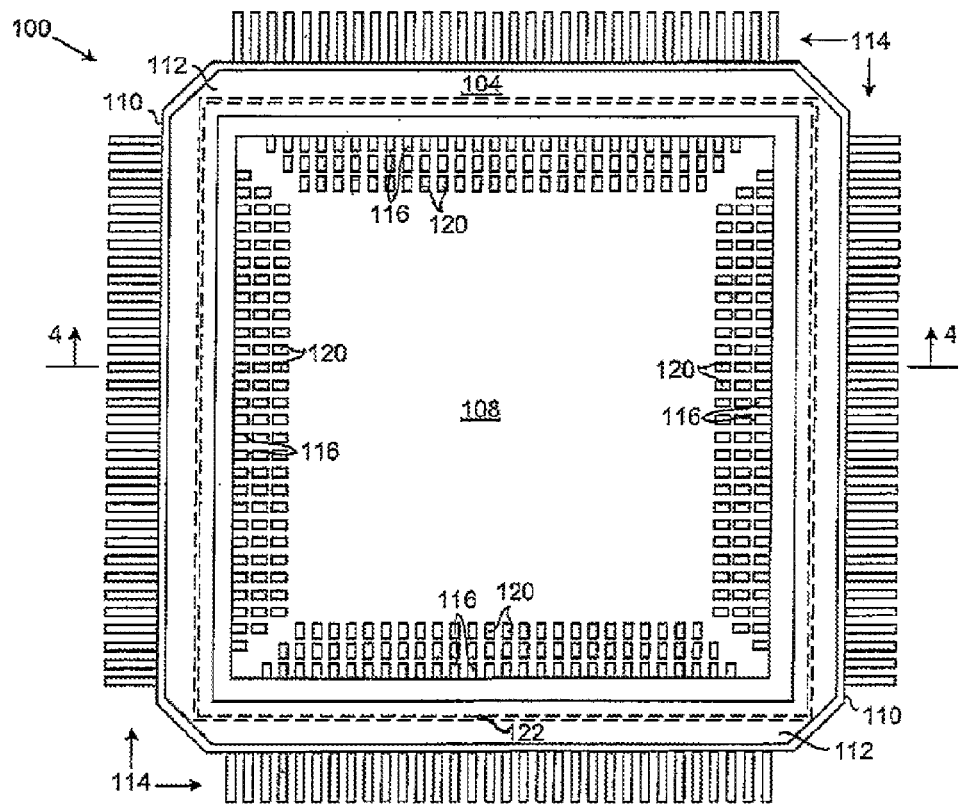
FIG. 6 is a bottom plan view of the QFP device of FIG. 4.
Figure 7:
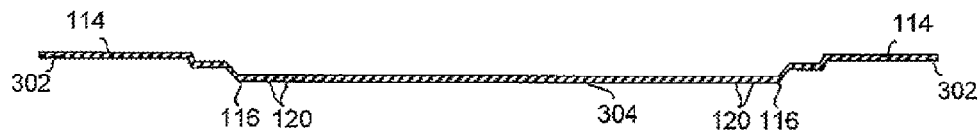
FIG. 7 is a side cross-sectional view of a lead frame used in a method of assembling the QFP device of FIG. 4.
Figure 8:
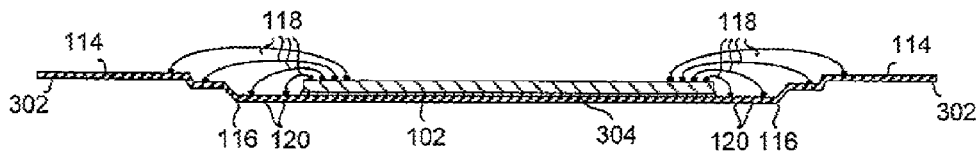
FIG. 8 is a side cross-sectional view of the lead frame of FIG. 7 with a semiconductor die mounted on it.

FIGS. 4 and 6 illustrate a surface mount, QFP semiconductor device 100 in accordance with an embodiment of the invention, given by way of example, while FIG. 5 illustrates the QFP device 100 connected mechanically and electrically with an external electrical circuit 202, such as a printed circuit board (PCB).

The QFP device 100 comprises a semiconductor die 102 having an active face with die bond pads. The die bond pads allow for electrical connection to integrated circuitry formed within the die 102. The device 100 also includes a package body 104 having opposing top and bottom surfaces 106, 108, a side surface 110. In the embodiment shown, the package body 104 is quadrangular. There is a step surface 112 between the bottom surface 108 and the side surface 110. In a preferred embodiment, the step surface 112 is co-planar with and intermediate to the top and bottom surfaces 106 and 108. The die 102 is embedded within the package body 104.

A plurality of electrical leads 114 project from at least two opposite side surfaces 110 and allow for connection to the external electrical circuit 202 (FIG. 5). The electrical leads 114 have inner ends supported in the package body 104 at the step surface 112. At least a first set of exposed electrical contacts 116 are exposed in the bottom surface 108 in at least two rows adjacent respectively to the opposite side surfaces 110 and like the electrical leads 114, allow for connection to the external electrical circuit 202. Both the electrical leads 114 and the first set of exposed contacts 116 are connected with respective ones of the die bond pads with bond wires 118. The first set of exposed contacts 116 have outer ends positioned in the package body 104 at the step surface 112 that are aligned with, but spaced from, respective inner ends of the electrical leads 114 at the adjacent side surfaces 110.

The electrical leads 114 may extend outside the package body 104 from an intermediate level of the side surface 110, and down to the level of the bottom surface 108 for connection to the external electrical circuit 202. The intermediate level of the side surface 110 may be higher than the level of the step surface 112 relative to the level of the bottom surface 108.

Preferably there is at least one further set of exposed electrical contacts 120 exposed in the bottom surface 108 in at least two rows adjacent respectively to the opposite side surfaces 110 and connected with the die bond pads. The rows of the further set of contacts 120 are positioned in the bottom surface 108 closer to the middle of the package body 104 than the rows of the first set of contacts 116, and the bond wires 118 connect the die bond pads to the further set of contacts 120 at positions closer to the middle of the bottom surface 108 than the first set of contacts 116.

FIGS. 7 to 10 illustrate a QFP device, such as the QFP device 100 described above, in various stages of assembly while FIG. 11 is a flow chart of the assembly steps in accordance with an embodiment of the invention, given by way of example. Thus, those elements that are the same as those of the device 100 shown in FIGS. 4-6 use the same element numbers. The method 400 starts at 402 by providing a lead frame 302 similar to the lead frame 62 used for the conventional device 60. The lead frame 302 includes electrical leads 114 having respective inner ends, and an array of at least first sets of rows of bottom face electrical contacts 116 having respective outer ends integral with and supported by the inner ends of the electrical leads 114. The rows of electrical leads 114 and the first sets of rows of bottom face electrical contacts 116 are positioned at least at two opposite sides of the quadrangle the lead frame 302. The leads 114 and the first sets of rows of contacts 116 may be positioned at all four sides of the respective quadrangle of the lead frame 302.

At 404, a semiconductor die 102 having die bond pads on its active surface is provided and mounted on a flag 304 of the lead frame 302 such that the active surface faces up, as is known by those of skill in the art. The die 102 may be attached to the flag 304 using a die bond adhesive or a two-sided tape. The die bond pads are connected electrically with the leads 114 and the bottom face electrical contacts 116 at step 406 with bond wires 118. At step 408, a molding process is performed in which the die 102 and bond wires 118 are encapsulated and a package body 104 is formed. The package body 104 has top, bottom and side surfaces 106, 108 and 110. In addition, during the molding process, a step surface 112 between the bottom and side surfaces 108 and 110 is formed. The step surface 112 is positioned at a level offset from the level of the bottom surface 108. The leads 114 project from the side surfaces 110 and the bottom face electrical contacts 116 are exposed in the bottom surface 108 in at least two rows adjacent to the opposite sides of the respective side surface 110. The outer ends of the bottom face electrical contacts 116 of the first set and the inner ends of the leads 114 are positioned in the package body 104 at the step surface 112. The outer ends of the bottom face electrical contacts 116 and the inner ends of the electrical leads 114 may be exposed.

At 410, a singulation operation is performed that not only separates adjacent formed devices from each other, but also separates and isolates electrically the outer ends of the bottom face electrical contacts 116 of the first set from the respective inner ends of the electrical leads 114 at the step surfaces 112.

The first set of exposed electrical contacts 116 have inner ends that are exposed in the bottom surface 108, while the inner ends of the leads 114 and the outer ends of the bottom face electrical contacts 116 at a level corresponding to the step surface 112 and offset from the level of the inner ends of the bottom face electrical contacts 116 are encapsulated.

Note that the bond wires 118 extend from the die bond pads on the active surface of the die 102 to various places on the lead frame 302, including inner lead ends of the leads 114 so that signals can be transmitted to/from the die by way of the leads 114; a first down set proximate to the inner lead ends at the step 112 so that signals can be transmitted to/from the die 102 by way of the first exposed contacts 116; and at a second down set, which is a top surface of an at least one further set of exposed electrical contacts 120 so that signals can be transmitted to/from the die 102 by way of the additional exposed contacts 120.

The method 400 includes a step 412 of shaping the singulated electrical leads 114 such that the leads 114 extend out from an intermediate level of the side surfaces 110 and down to the level of the bottom surface 108.

In more detail, after encapsulation, the bottom face electrical contacts 116 and 120 and the electrical leads 114 are supported by the package body 104 and the singulation operation isolates the individual contacts and leads electrically from each other. Before encapsulation and singulation, in the lead frame 300 the bottom face electrical contacts 116 of the first set and 120 of the further set are integral with, supported by and aligned with the electrical leads 114. There is therefore no requirement for increased lateral spacing, such as is required in the interleaved structure 60. In particular, the bottom face electrical contacts 116 and 120 can be at the minimum spacing, without any interleaving of side leads such as 82 in the structure of the device 60. The configuration of the device 100 offers a greater number of input/output (I/O) connections using the electrical leads 114 and the bottom face electrical contacts 116 and 120 in a given foot print (or the same number of I/O connections in a smaller footprint) than the device 60 and enables I/O connections with one, or more than one semiconductor die 102, which may be stacked or side by side. The electrical leads 114 may be formed to J-lead shape, as shown, or to gull-wing shape.

Figure 9:
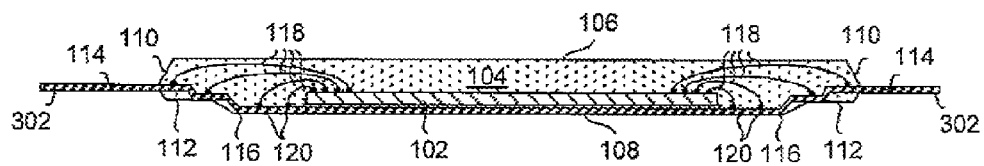
FIG. 9 is a side cross-sectional view of the lead frame and die assembly of FIG. 8 after being encapsulated with a mold compound.
Figure 10:
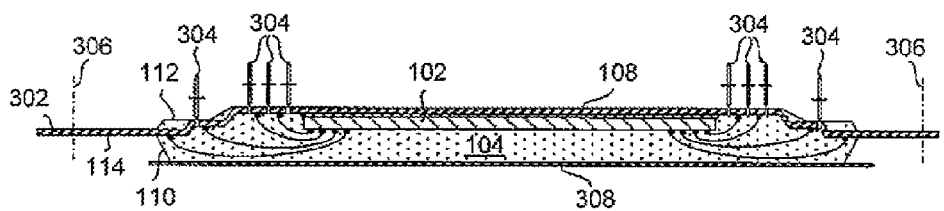
FIG. 10 is a side cross-sectional view of the assembly of FIG. 9 during a singulation operation.
Figure 11:
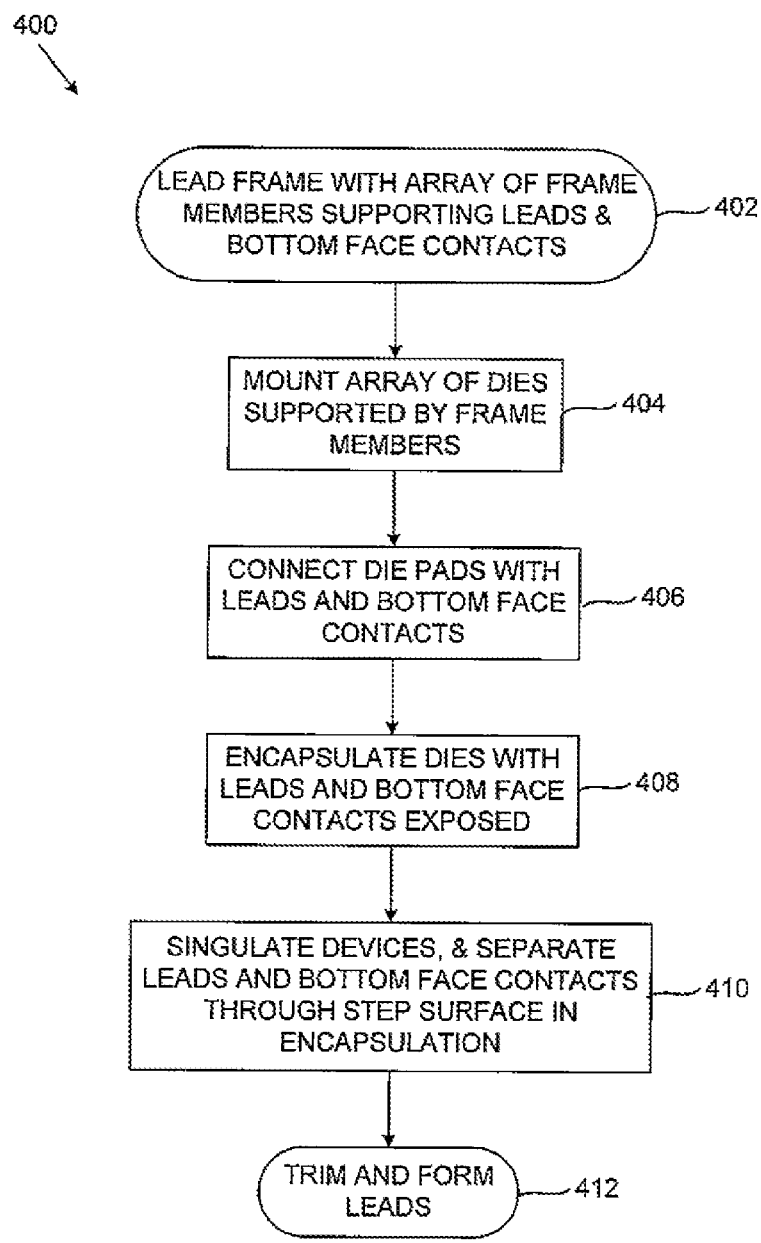
FIG. 11 is a flow chart of a method of assembling a QFP device in accordance with an embodiment of the present invention.

As shown in FIGS. 4, 9 and 10, the lead frame 302 has a double down set. Accordingly, the bond wires 118 are bonded to the leads 114, to the first set of bottom face electrical contacts 116 and to the further set of bottom face electrical contacts 120 at three different levels, which spaces the bond wires 118 apart more than if the bonds zones were all at the same level, and facilitates ensuring that the bond wires 118 do not short together even when they are bonded to aligned leads and bottom face electrical contacts.

The package body 104 is formed with the step surface 112 positioned at a level offset from the level of the bottom surface 108. The step surface 112 may be formed by injecting molding compound into a customized mold chase, with step features to form the step surfaces. The double down set of the lead frame 302 brings the outer ends of the bottom face electrical contacts 116 and the inner ends of the electrical leads 114 to the level of the step surface 112. Accordingly, singulation 410 can separate the outer ends of the bottom face electrical contacts 116 from the respective inner ends of the electrical leads 114 through the step surface 112. The operation of separation can be performed by sawing through little or no molding compound of the package body 104 as illustrated schematically by saw blades 304 in FIG. 10. The saw operation can be performed along saw streets extending across an array of lead frames, and then trimming and forming the leads 114. The top surface 106 of the package body 104 can be attached to a tape 308 before the saw operation and then de-taped for trimming and forming. In another example, taping and de-taping are avoided, for instance by using jig saw singulation techniques. The lead frame 300 may be provided half-etched over a width greater than the saw streets; sawing through the thickness of the material of the lead frame 300 then leaves notches in the sides of the bottom face electrical contacts 116 and 120, which are filled with molding compound during encapsulation 408 to help lock the exposed bottom face electrical contacts 116 and 120 into the package body 104. As indicated in the bottom view of FIG. 6 in dashed lines 122, the saw streets that separate the outer ends of the bottom face electrical contacts 116 from the respective inner ends of the electrical leads 114 through the step surfaces 112 appear in the step surface 112, even if they are filled subsequently with electrical insulation.

The semiconductor device 100 illustrated is a QFP device. However, it will be appreciated that this example of an embodiment of the invention is also applicable to other types of semiconductor device such as small outline integrated circuits (SOICs), thin small outline packages (TSOP), plastic leaded chip package (PLCC) devices, and small outline J-lead (SOJ) devices.

In the foregoing specification, the invention has been described with reference to specific examples of embodiments of the invention. It will, however, be evident that various modifications and changes may be made therein without departing from the broader spirit and scope of the invention as set forth in the appended claims.

For example, the semiconductor die described herein can be any semiconductor material or combinations of materials, such as gallium arsenide, silicon germanium, silicon-on-insulator (SOI), silicon, monocrystalline silicon, the like, and combinations of the above. The semiconductor die may include integrated circuits (ICs) such as processors, controllers and other circuits. The semiconductor die may include micro-electro-mechanical systems (MEMS) and sensors and other circuit elements, for example. The semiconductor die may also include, or be associated with, components of metals or metal alloys or ceramics, for example.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

In the claims, the word 'comprising' or 'having' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A surface mount semiconductor device, comprising:
   a semiconductor die having an active face with die bond pads;
   a package body having top and bottom surfaces, a side surface having quadrangular sides, and a step surface between the top and bottom surfaces and adjacent to the side surface at a level offset from the bottom surface, wherein the die is embedded within the package body;
   a plurality of electrical leads that allow for connection to an external electrical circuit, wherein the electrical leads are connected with first ones of the die bond pads, and wherein the electrical leads have inner ends supported in the package body at the step surface and outer lead ends that project from at least two opposite side surfaces; and
   at least a first set of exposed electrical contacts exposed in the bottom surface in at least two rows adjacent respectively to the at least two opposite side surfaces for connection to the external electrical circuit, wherein the first set of exposed contacts are connected with second ones of the die bond pads, and wherein the first set of exposed contacts have outer ends positioned in the package body at the step surface and aligned with but spaced from respective inner ends of the electrical leads at an adjacent side surface of the at least two opposite side surfaces by a saw street formed at the step surface.

2. The semiconductor device of claim 1, wherein the electrical leads extend outside the package body from an intermediate level of the side surface, down to a level of the bottom surface.

3. The semiconductor device of claim 2, wherein the intermediate level of the side surface is higher than the level of the step surface relative to the level of the bottom surface.

4. The semiconductor device of claim 1, wherein the first set of exposed contacts have inner ends exposed in the bottom surface.

5. The semiconductor device of claim 1, further comprising bond wires that connect the die bond pads with the electrical leads and the first set of exposed contacts respectively.

6. The semiconductor device of claim 5, wherein the bond wires are attached to the electrical leads farther from a middle of the bottom surface than the inner ends of the electrical leads.

7. The semiconductor device of claim 6, wherein the bond wires connect to the outer ends of the first set of exposed contacts.

8. The semiconductor device of claim 1, further comprising at least one further set of exposed electrical contacts that is exposed in the bottom surface in at least two rows adjacent respectively to the opposite side surface for connection to the external electrical circuit, wherein the further set of exposed contacts are connected with third ones of the die bond pads, and the rows of the further set of exposed contacts are positioned in the bottom surface closer to a middle of the bottom surface than the rows of the first set of exposed contacts.

9. The semiconductor device of claim 8, wherein additional bond wires connect the third die bond pads with the further exposed contacts set at positions closer to the middle of the bottom surface than the first set of exposed contacts.

* * * * *